United States Patent
Otsubo

(10) Patent No.: US 10,905,040 B2
(45) Date of Patent: Jan. 26, 2021

(54) COMPONENT FEEDER

(71) Applicant: FUJI CORPORATION, Chiryu (JP)

(72) Inventor: Satoru Otsubo, Anjyo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/466,917

(22) PCT Filed: Dec. 21, 2016

(86) PCT No.: PCT/JP2016/088214
§ 371 (c)(1),
(2) Date: Jun. 5, 2019

(87) PCT Pub. No.: WO2018/116428
PCT Pub. Date: Jun. 28, 2018

(65) Prior Publication Data
US 2020/0068753 A1    Feb. 27, 2020

(51) Int. Cl.
*H05K 13/02* (2006.01)
*H05K 13/04* (2006.01)

(52) U.S. Cl.
CPC ....... *H05K 13/023* (2013.01); *H05K 13/0419* (2018.08)

(58) Field of Classification Search
CPC .. H05K 13/023; H05K 13/0419; H05K 13/02; H05K 13/0417; H05K 13/021; H05K 13/0408; Y10T 156/1057
See application file for complete search history.

(56) References Cited

U.S. PATENT DOCUMENTS

| 4,398,573 A * | 8/1983 | Kreid ............... H05K 13/023 140/105 |
| 2019/0029151 A1* | 1/2019 | Morikawa ........... H05K 13/026 |

FOREIGN PATENT DOCUMENTS

JP    60-207400 A    10/1985

OTHER PUBLICATIONS

International Search Report dated Mar. 21, 2017 in PCT/JP2016/088214 filed Dec. 21, 2016.

* cited by examiner

*Primary Examiner* — Mark A Osele
*Assistant Examiner* — Christopher C Caillouet
(74) *Attorney, Agent, or Firm* — Oblon, McClelland, Maier & Neustadt, L.L.P.

(57) ABSTRACT

A component feeder including a feeding mechanism configured to intermittently feed taped components in a feeding direction at a specified feeding pitch to a supply position; first lead cutting mechanism configured to, for separating the component positioned at the supply position from the carrier tape, in a case in which the component has three leads, cut two of the leads Leo that are on an outer side of the three leads at a given position such that a length by which the two leads protrudes from the component main body is a first length; and second lead cutting mechanism configured to, before the cutting of the two leads by the first lead cutting mechanism, cut a single lead that is at a center of the three leads positioned forward of the supply position in the feeding direction to a second length that is shorter than the first length.

5 Claims, 17 Drawing Sheets

(a)

(b)

(c)

(a)

(a)

(b)

(c)

COMPONENT FEEDER

TECHNICAL FIELD

The present application relates to a component feeder for supplying components, that is, a component feeder that consecutively supplies component to a specified supply position using taped components.

BACKGROUND ART

Among electronic components and the like, there are components that include multiple leads that protrude in a given direction from a component main body (these are generally referred to as "radial components", a convention that this specification also follows in some cases). When performing mounting work onto a board, such components are prepared in a state with multiple components held at a specified pitch in carrier tape by the leads, that is, the components are prepared as taped components, and the taped components are supplied by a component feeder to a specified supply position having had their leads cut. When mounting components with three leads, for example, as disclosed in the patent literature below, there are cases in which the center lead of the three is cut shorter than the two leads on either side of the center lead.

CITATION LIST

Patent Literature

Patent literature 1: JP-S60-207400

BRIEF SUMMARY

Problem to be Solved

There is no disclosure in the above patent literature of a specific means for cutting leads and supplying the components, that is, a component feeder that supplies a radial component with three leads to a specified supply position while cutting a center lead shorter than the two surrounding leads. The inventors have developed a practical component feeder as such a component feeder. The present disclosure is the fruit of this development and an object thereof is to provide a practical component feeder that supplies a component with three leads while cutting those leads.

Means for Solving the Problem

To solve the above problems, a component feeder of the present disclosure is a component feeder including:
a feeding mechanism configured to intermittently feed taped components in a feeding direction at a specified feeding pitch to a supply position;
a first lead cutting mechanism configured to, for separating the component positioned at the supply position from the carrier tape, for the component having three leads, cut two of the leads that are on an outer side of the three leads at a given position such that a length by which the two leads protrudes from the component main body is a first length; and
a second lead cutting mechanism configured to, before the cutting of the two leads by the first lead cutting mechanism, cut a single lead that is at a center of the three leads positioned forward of the supply position in the feeding direction to a second length that is shorter than the first length.

According to a component feeder of the present disclosure, while taped components are fed by a feeding mechanism, after a center lead has been cut, the two outer leads are cut at the supply position. Accordingly, even for a component for which the length of the center lead is different to the length of the outer leads, supply can be performed appropriately.

DESCRIPTION OF EMBODIMENTS

Hereinafter, a representative embodiment of the present disclosure is described with reference to the drawings. Note that, in addition to the following embodiments, the present disclosure can be realized in various forms with changes or improvements implemented based on knowledge of someone skilled in the art.

EMBODIMENTS

Described below is supply that may be performed by a component feeder of an embodiment, which is supply of a typical component, that is, supply of a component with two leads extending in one direction from a component main body, after which is described supply of a component with three leads extending in one direction from a component main body.

A. Component Mounter on which Component Feeder is Loaded

Figure 1:
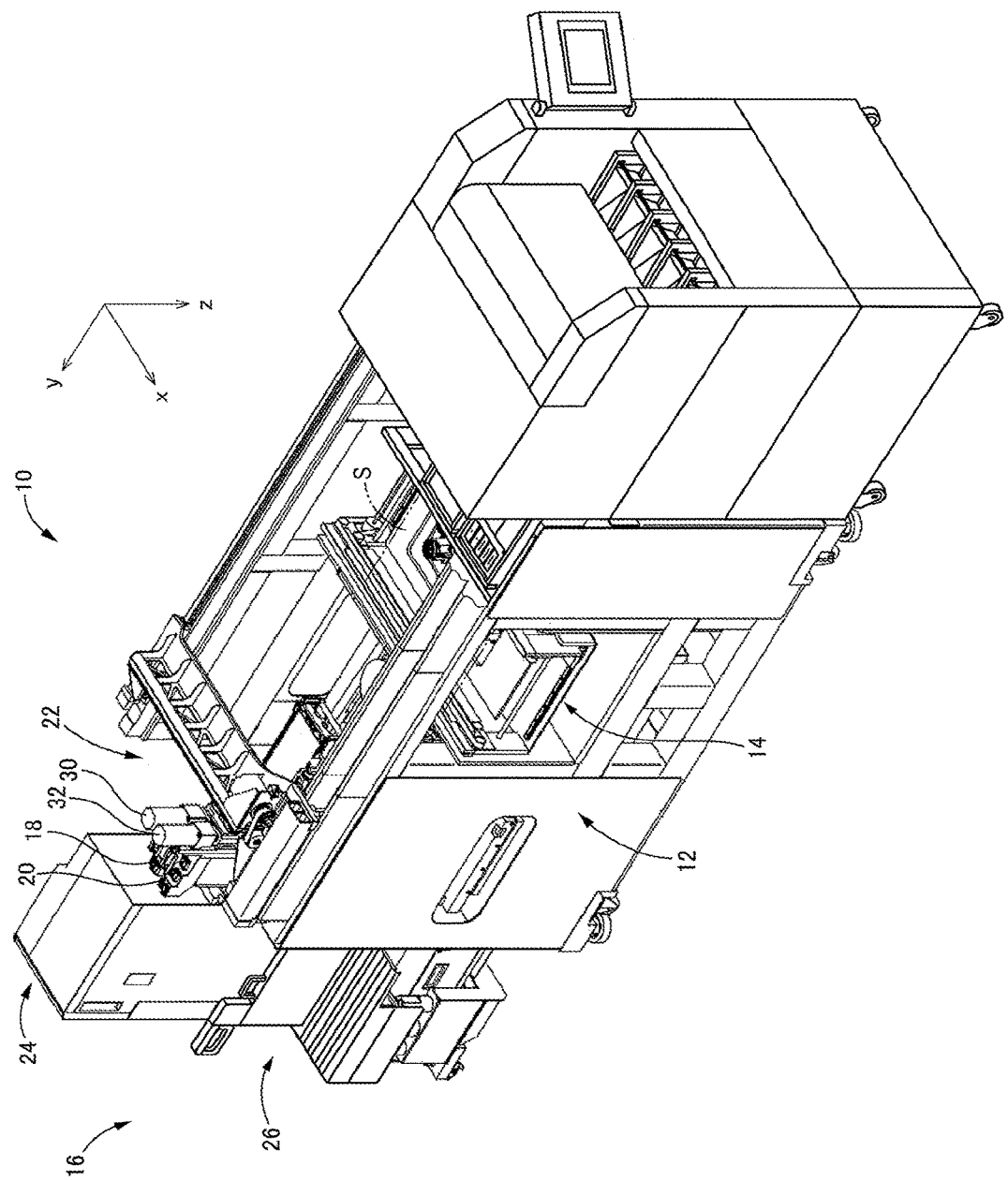
FIG. 1 is a perspective view of a component mounter loaded with a component feeder that is an embodiment of the present disclosure.

Component mounter 10 on which a component feeder of an embodiment is loaded, as shown in FIG. 1, is configured with main body 12, board conveying and fixing device 14 that conveys and fixes board S, component supply device 16 that supplies components such as electronic components, mounting heads 18 and 20 that pick up a component supplied from component supply device 16 and mount the component on board S fixed by board conveying and fixing device, and head moving device 22 that moves mounting heads 18 and 20 in a horizontal plane to and from component supply device 16 and board conveying and fixing device 14. Note that, head moving device 22 is an XY robot type moving device and moves mounting heads 18 and 20 in the X and Y directions shown in the figure.

Component supply device 16 includes tray-type component supply device 24 that supplies component arranged in trays, and feeder-type component supply device 26 that supplies taped components. In the figure, only one feeder-type component supply device 26 is arranged, but multiple of the devices may be arranged in a line. Details are described later, but feeder-type component supply device 26 shown in the figure is a component feeder of the embodiment, and below this feeder is also referred to as component feeder 26. However, component feeder 26, as described later, is for supplying components that include multiple leads, that is, leaded components.

Figure 2:
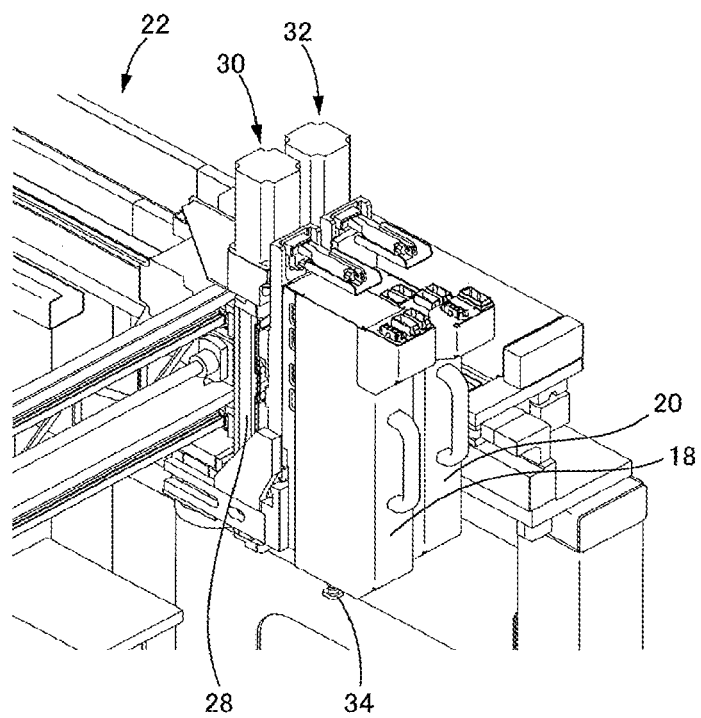
FIG. 2 is a perspective view of a mounting head and a head moving device of the component mounter from the opposite side to FIG. 1.

As shown in FIG. 2, mounting heads 18 and 20 are attached to the same slider 28 via head raising and lowering devices 30 and 32 that respectively raise and lower mounting heads 18 and 20, and by slider 28 being moved by head moving device 22, mounting heads 18 and 20 are moved in a horizontal plane together. On the other hand, mounting heads 18 and 20 are raised and lowered independently by head raising and lowering devices 30 and 32. That is, head raising and lowering devices 30 and 32 move mounting heads 18 and 20 in a vertical direction (the Z direction in FIG. 1).

Figure 3:
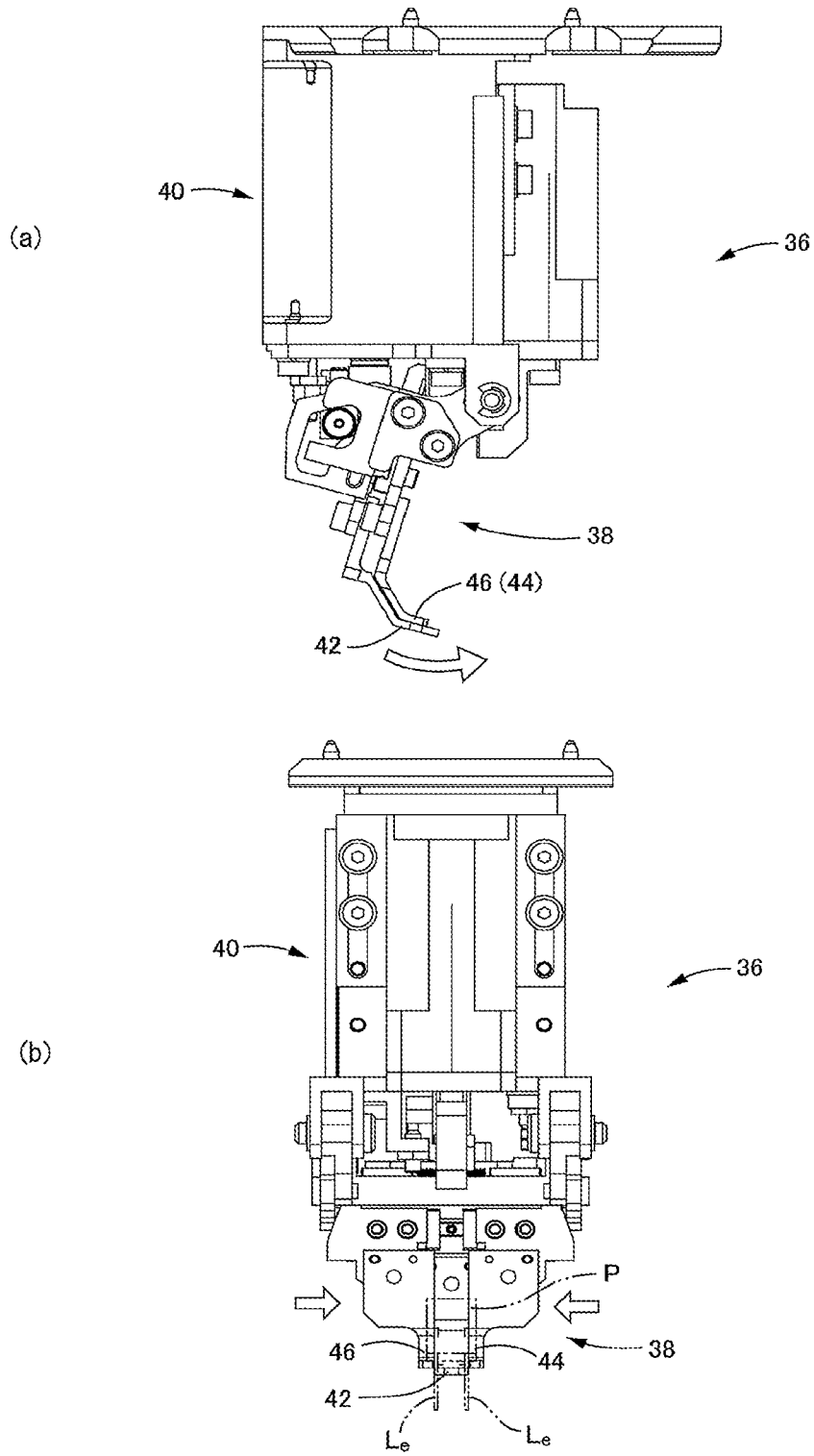
FIG. 3 shows a chuck device of the mounting head.

Mounting head 18, mainly, is for loading a component supplied from tray-type component supply device 24 onto a surface of a board, and a lower section thereof is provided with suction nozzle 34, which uses negative pressure to hold a component by suction, as a component holding device. On the other hand, mounting head 20, mainly, is for inserting the multiple leads of components supplied from component feeder 26 into holes provided in a board, and a lower section thereof is provided with chuck device 36 shown in FIG. 3. Note that, FIG. 3(a) shows chuck device 36 from the Y direction of FIG. 1, and FIG. 3(b) is a view from the X direction.

Figure 4:
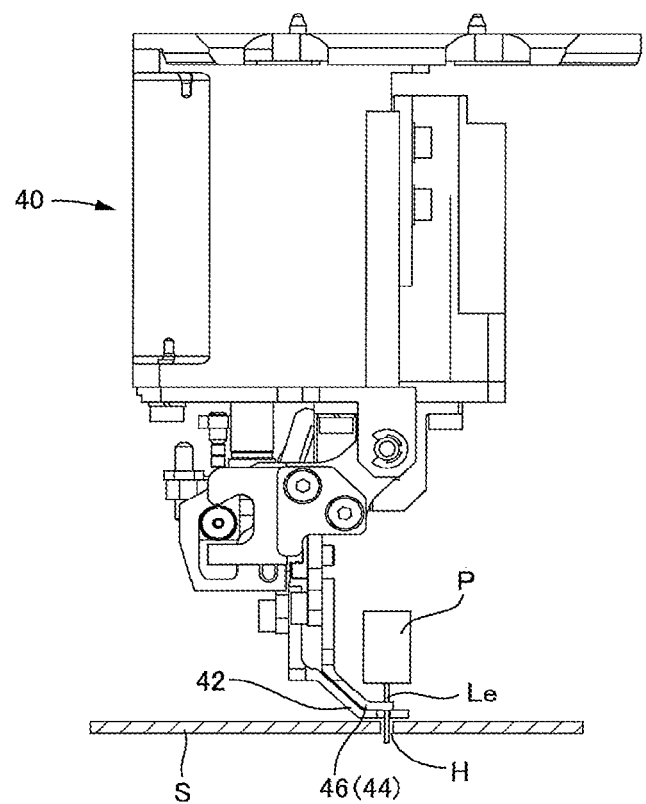
FIG. 4 illustrates a state of a component held by the leads by a chuck of the chuck device being mounted on a board.

Chuck device 36 is configured from chuck 38 and chuck driving device 40; chuck 38 is configured from fixed claw 42, and open-close claws 44 and 46 provided on each side of fixed claw 42. Detailed descriptions are omitted, but chuck driving device 40 swings chuck 38 in a direction shown by the white arrow in FIG. 3(a). Chuck 38 is configured such that open-close claws 44 and 46 close in accordance with this swinging. Leaded component P (also sometimes referred to simply as "component P") that includes two leads Le is supplied from component feeder 26; chuck 38, in the closed position, as shown in FIG. 3(b), sandwiches one of the leads Le using open-close claw 44 and fixed claw 42 and sandwiches the other of the leads Le using open-close claw 46 and fixed claw 42. Then, as shown in FIG. 4, the component P held by chuck 38 is mounted on board S by the leads Le being inserted into holes H provided in board S.

B. Taped Components Handled by the Component Feeder

Figure 5:
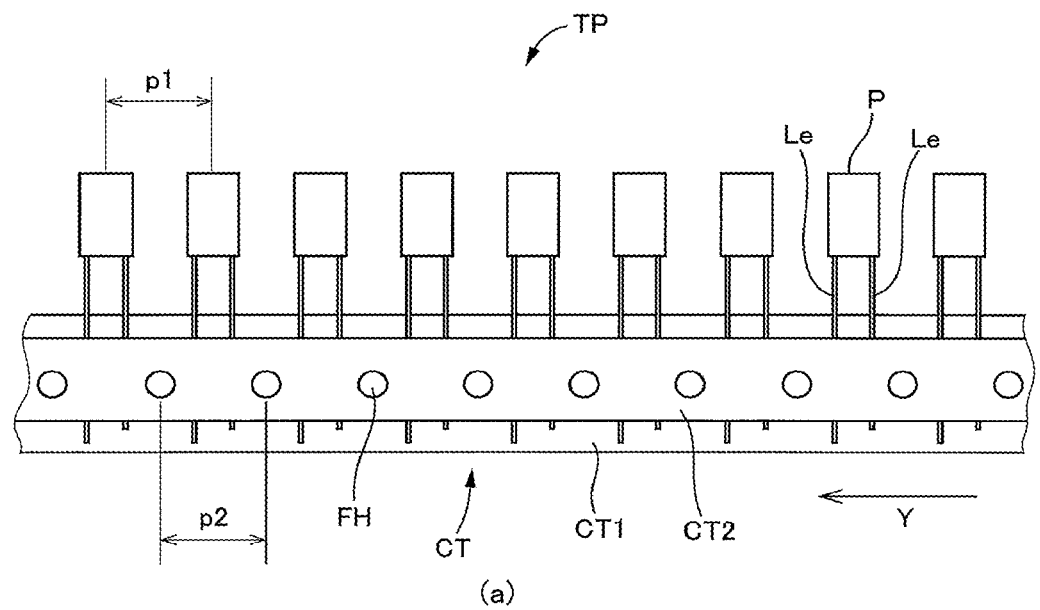
FIG. 5 shows taped components handled by the component feeder.
Figure 5:
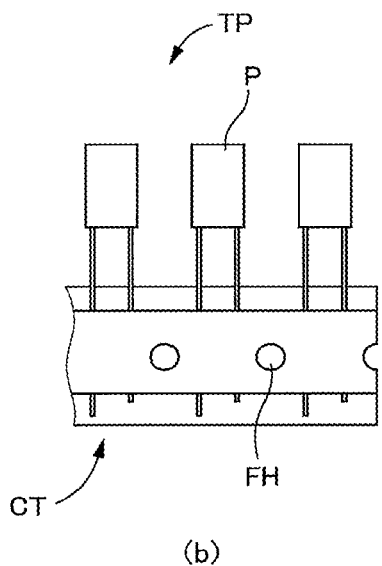
Figure 5:
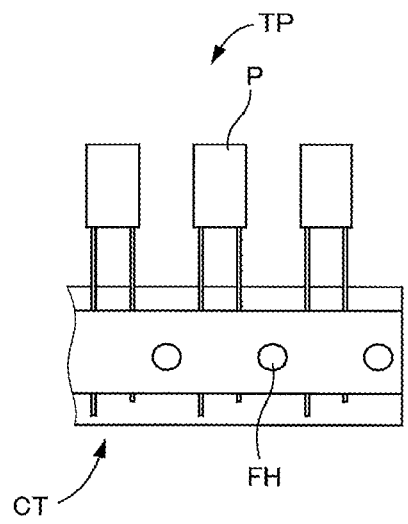

Taped components handled by the component feeder 26, for example, as shown in FIG. 5(a), are an item in which components P such as electronic components are held in carrier tape CT at a specified arrangement pitch p1; taped components TP shown in FIG. 5(a) are configured with multiple leads Le (in this case, two leads Le) of the leaded components P such as an electrolytic capacitor held in carrier tape CT. Note that, component P is a component in which the two leads Le extend parallel in the same direction, with such components also referred to as radial leaded components. Carrier tape CT consists of relatively thick main tape CT1, and sticky adhesive tape CT2 affixed to main tape CT1; leads Le are sandwiched between CT1 and CT2.

Carrier tape CT is provided with indexing holes FH at a specified hole pitch, p2. Hole pitch p2 is set equal to the component P arrangement pitch p1, and each indexing hole FH is provided in between components P in the length direction of carrier tape CT. Indexing holes FH are used for feeding taped components TP by component feeder 26. Note that, with component feeder 26, taped components TP are fed in a specified direction, that is, the Y direction shown in the figure.

C. Component Feeder i) Overview of Component Feeder

Figure 6:
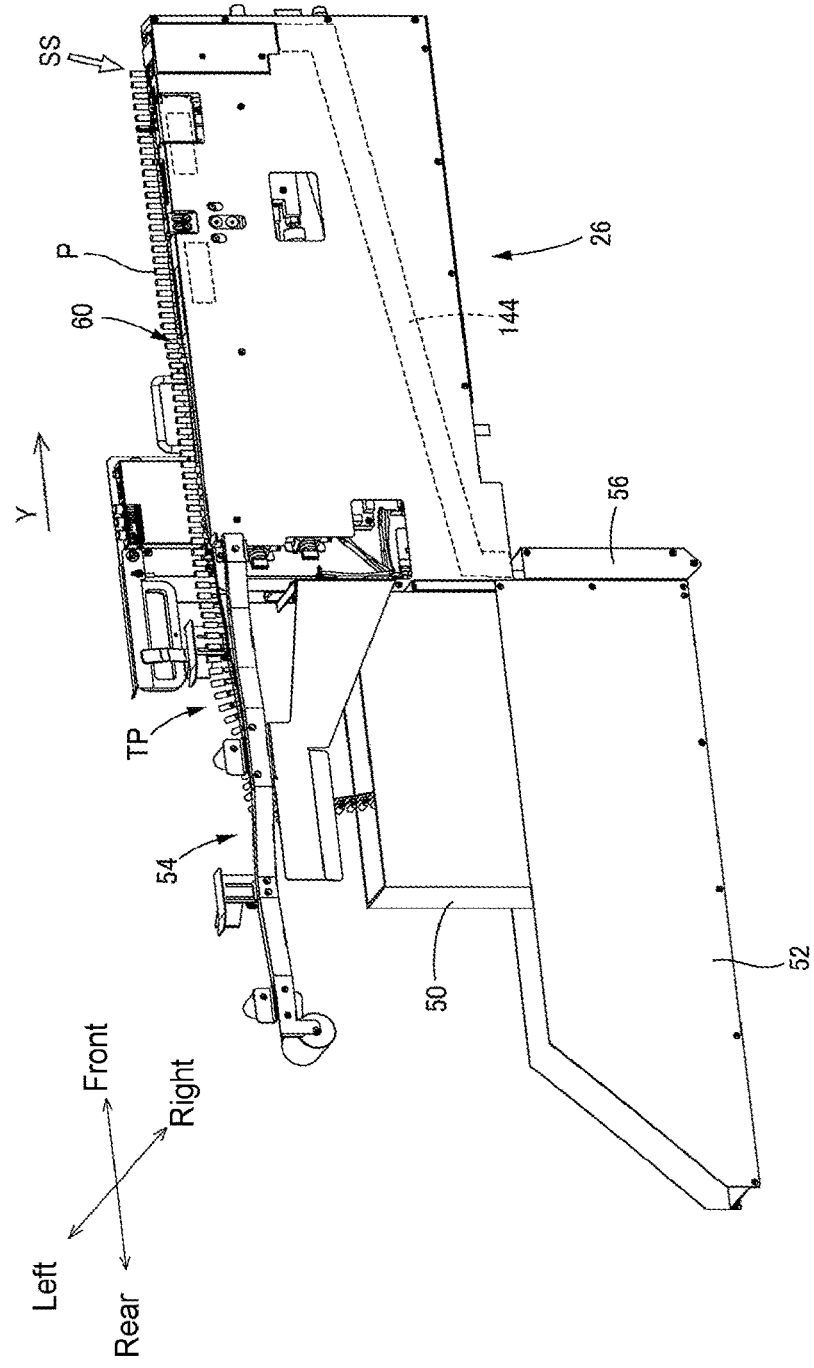
FIG. 6 is a perspective view of the main body of the component feeder.

Component feeder 26 of an embodiment, as shown in FIG. 6, is arranged on component supply device 16 of component mounter 10 in a state with the following items attached: box holder 52 that holds component housing box 50 that houses taped components TP, tape guide 54 that guides taped components TP housed in component housing box 50 held by box holder 52 onto component feeder 26, waste tape collection box 56 that collects cut carrier tape CT (described later), and the like.

Guidance groove 60 that extends lengthwise is provided on an upper section of component feeder 26 and taped components TP guided by tape guide 54 pass along guidance groove 60 from the rear end to the front end in the lengthwise direction of component feeder 26 while being fed intermittently at specified feeding pitch p3. In other words, the Y direction in the figure is the feeding direction. Note that, in descriptions below, for directions of component feeder 26, the right side in FIG. 6 is the front and the left side is the rear, and when looking facing the feeding direction of taped components TP, the left side is the left and the right side is the right.

Figure 7:
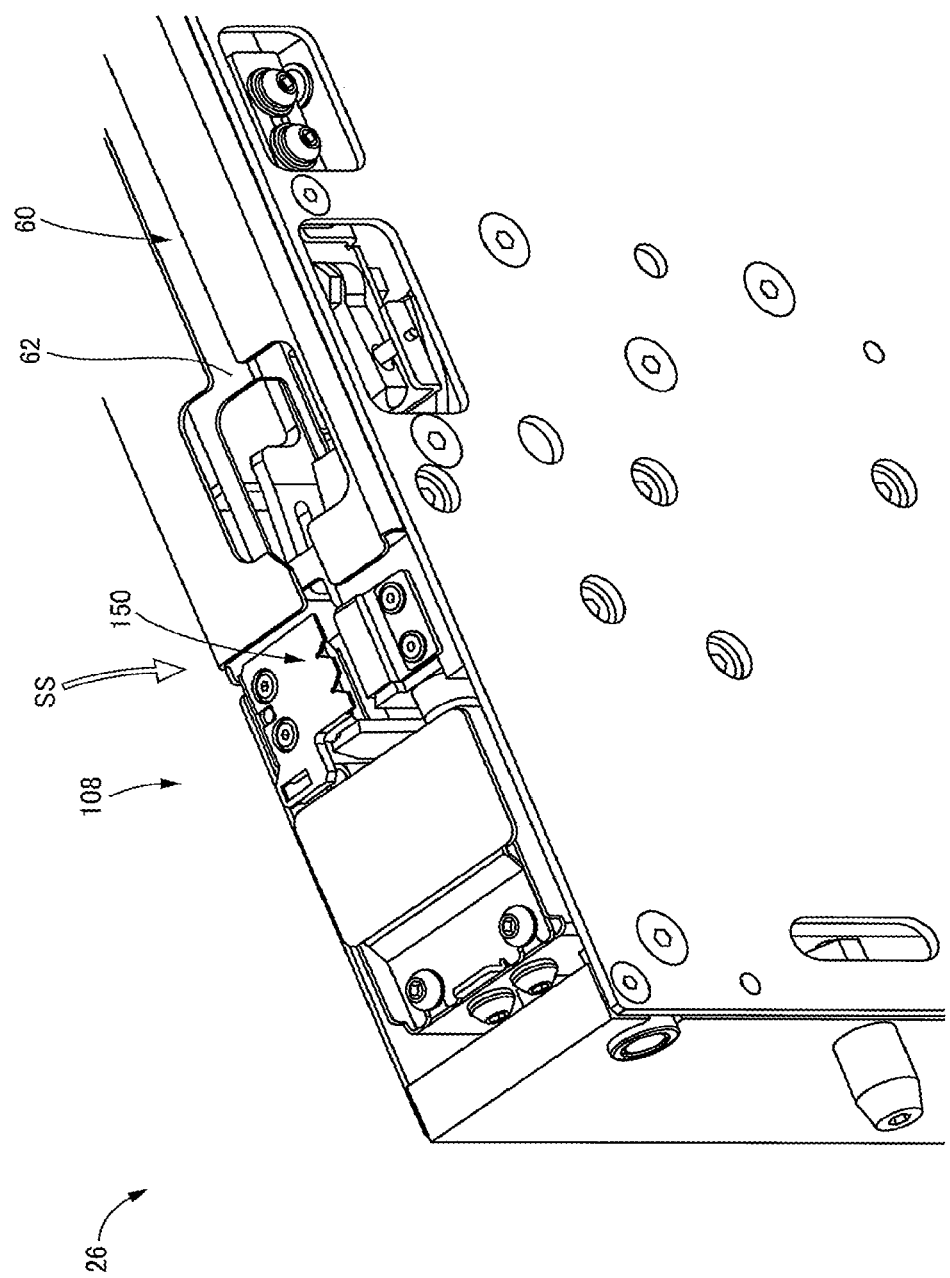
FIG. 7 is a perspective view showing a component supply position at the component feeder.

The position of the component furthest to the front in the figure is set as supply position SS on component feeder 26, and components P are supplied to that position. That is, component P positioned at supply position SS is held by mounting head 20 provided with chuck device 36 described above and then mounted on board S. Note that, FIG. 7 shows the portion at which supply position SS is from a diagonal perspective from the front right.

ii) Feeding Mechanism

Figure 8:
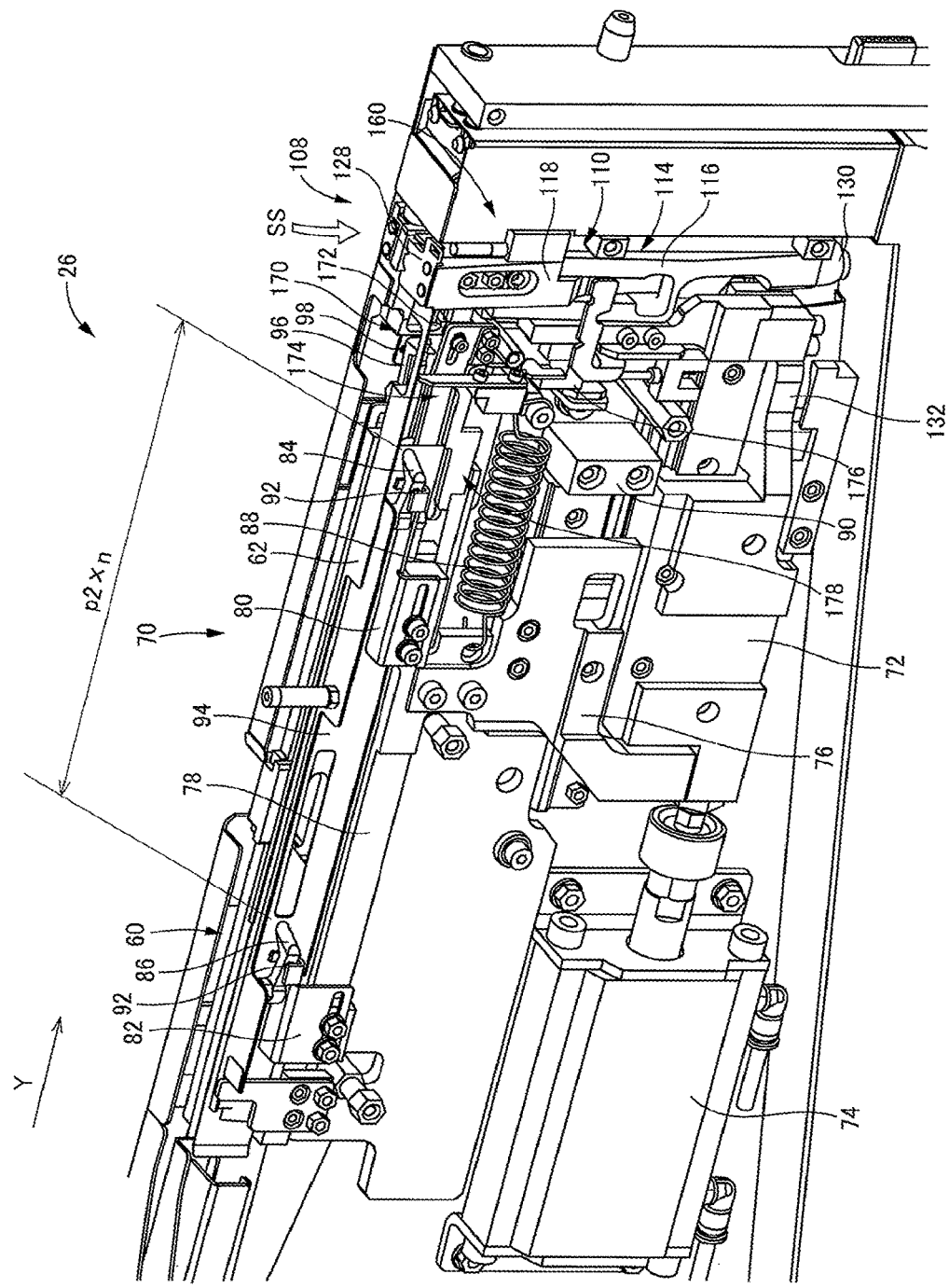
FIG. 8 is a perspective view of the internal configuration of the component feeder.

To describe referring to FIG. 8, which shows a state with external covers removed, taped components TP are held on guide rail 62 provided in guidance groove 60. Guide rail 62 has a portion forming a flange with a lower section bent into a U-shape on the left side and an upper section bent to the right side. In the figure, taped components TP are not shown, but taped components TP are held on the left side of guide rail 62 in a state collected at the lower section U-shaped portion. Component feeder 26 is provided with feeding mechanism 70 for feeding taped components TP forward in that state.

Feeding mechanism 70 is configured including: first slide 72 supported on the feeder main body to be movable in a front-rear direction; compound air cylinder 74 acting as an actuator to move first slide 72 forwards and backwards; second slide 76 supported on the feeder main body to move backwards and forwards in the front-rear direction in accordance with the operation of first slide 72; support bar 78 that operates together with second slide 76; bracket 80; and feeding claw 84 and feeding claw 86 rotatably supported on support bar 78 via bracket 82.

When first slide 72 is moved forwards by air cylinder 74, due to spring 88, which is an extension coil spring, provided between the feeder main body and second slide 76 (specifically, support bar 78), second slide 76 moves forwards in a state contacting first slide 72. Stopper 90 is provided on the feeder main body, and when movement has occurred to within a given distance, second slide 76 is stopped by stopper 90 such that forwards movement is stopped. In that state, only first slide 72 is allowed to move forwards. When returning first slide 72 backwards by air cylinder 74, at a given position, first slide 72 contacts second slide 76 stopped by stopper 90 and from that position second slide 76 and first slide 72 move backwards together.

Feeding claw 84 and feeding claw 86 and the base sections thereof are rotatably supported on bracket 80 and bracket 82 fixed to support bar 78, and can rotate within a horizontal plane. The ends of feeding claw 84 and feeding claw 86 face to the right. Arranged between each bracket 80 and 82 and feeding claws 84 and 86 is spring 92, which is a compression spring, and each feeding claw 84 and 86 is biased such that the tip faces to the left.

Stopping plate 94 is arranged between guide rail 62 and support bar 78 in a state extending in the front-rear direction. In the state shown in the figure, that is, a state with support bar 78 positioned to the rear, in other words, when second slide 76 is positioned at the rear limit of the movement range, the tip of each of feeding claw 84 and feeding claw 86 contacts stopping plate 94 due to the biasing of spring 92.

Figure 9:
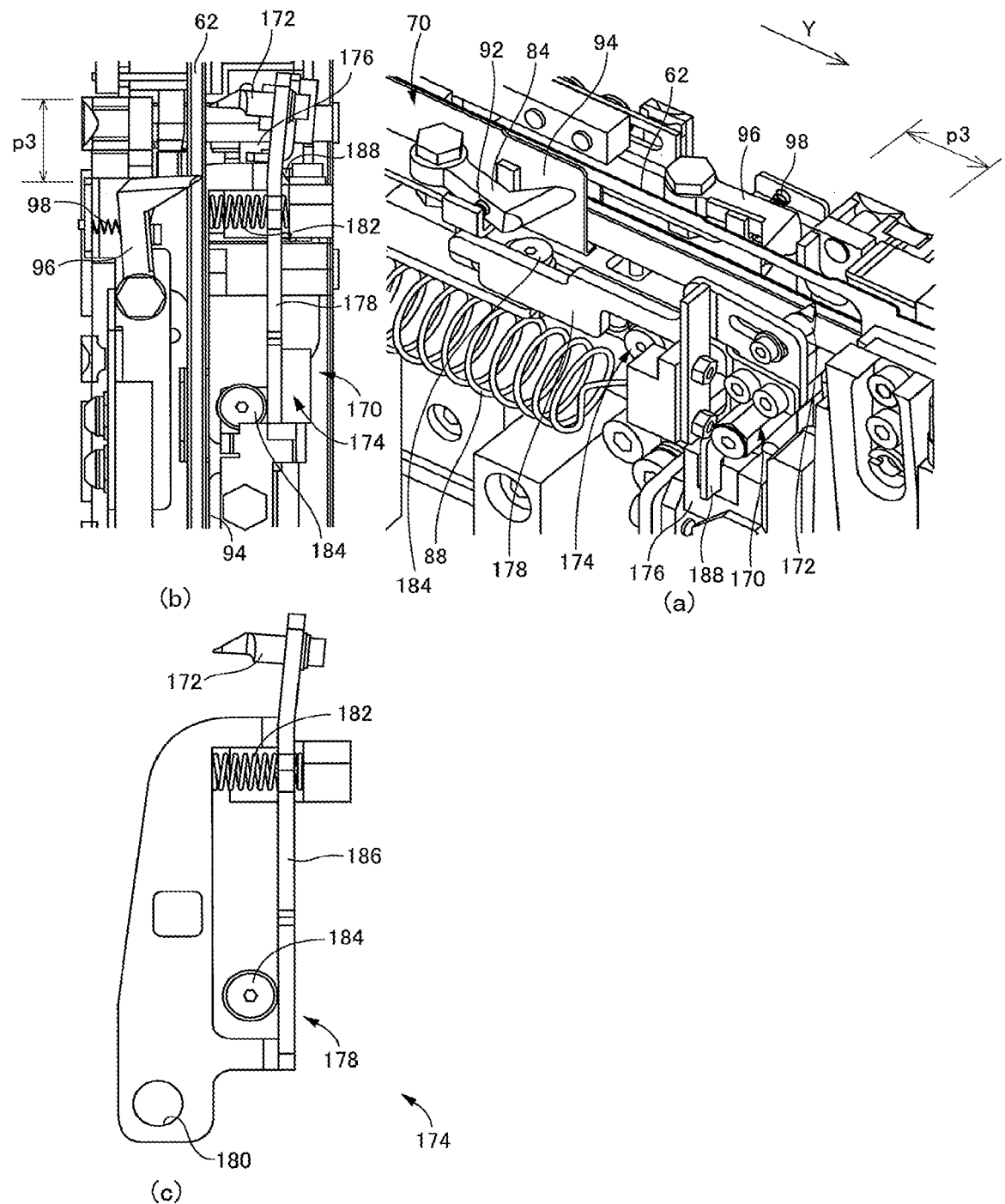
FIG. 9 shows a state of a portion of a feeding mechanism provided on the component feeder and a feeding check mechanism for checking the feeding amount by the feeding mechanism.
Figure 10:
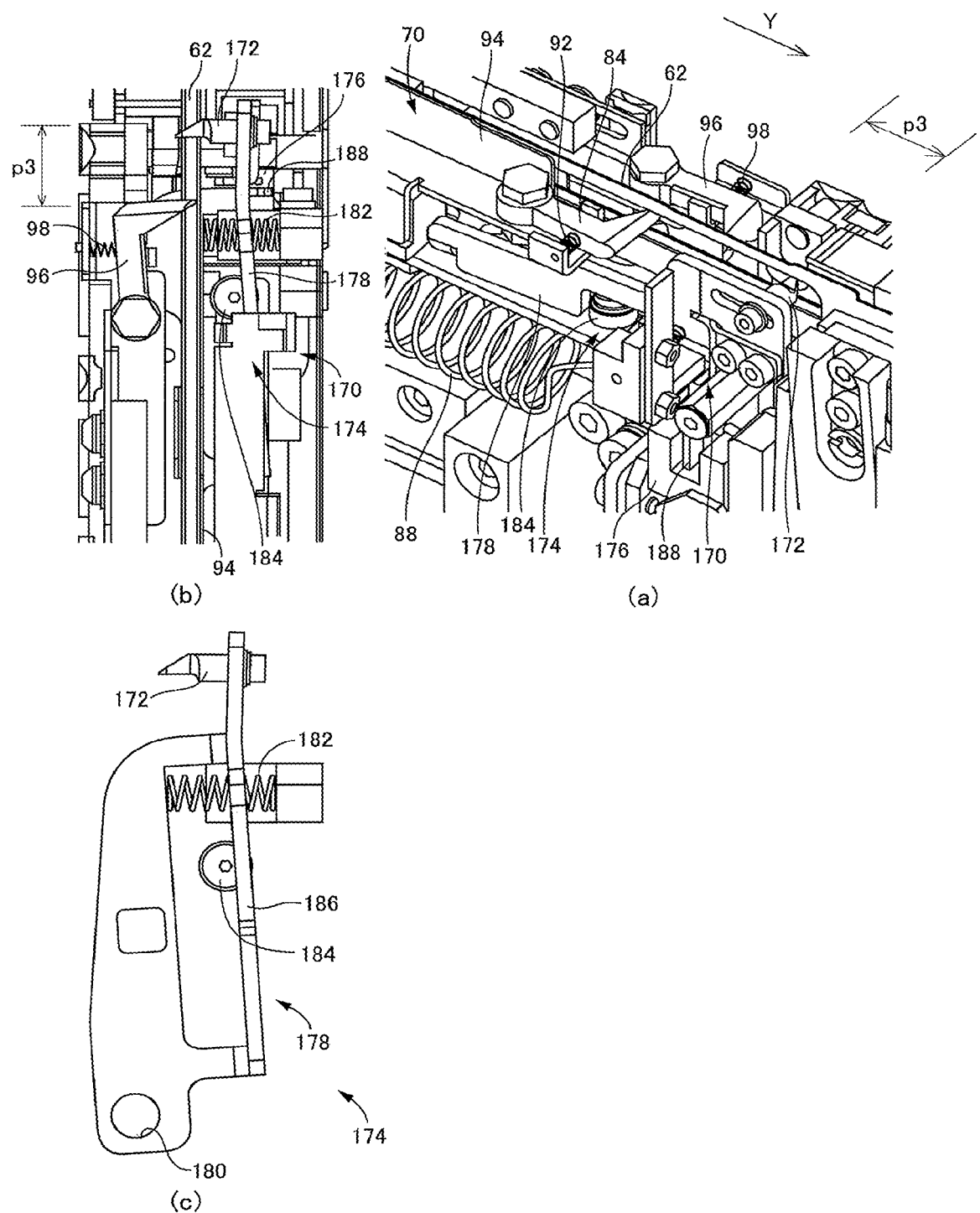
FIG. 10 shows a different state to that of FIG. 9 of a portion of a feeding mechanism provided on the component feeder and a feeding check mechanism for checking the feeding amount by the feeding mechanism.

Referring to FIGS. 9(*a*) and 10(*a*) showing an enlarged view of a portion at which feeding claw 84 is arranged, in a state with support bar 78 positioned to the rear, as shown in FIG. 9(*a*), the tip of feeding claw 84 contacts stopping plate 94. On the other hand, if second slide 76 advances such that support bar 78 advances, feeding claw 84 also advances, and as shown in FIG. 10(*a*), the tip of feeding claw 84 protrudes from the tip of stopping plate 94, and by the biasing force of spring 92, feeding claw 84 is rotated to a position protruding from an opening of guide rail 62. Although omitted from the figure, by the advancing of support bar 78, feeding claw 86 performs a similar operation, and the tip of feeding claw 86 protrudes from an elongated hole provided in stopping plate 94, and by the biasing force of spring 92, feeding claw 86 is rotated to a position protruding from an opening of guide rail 62.

The distance between the tip of feeding claw 84 and the tip of feeding claw 86 is a multiple of hole pitch p2 (p2×n) of indexing holes FH provided in taped components TP, and when the stopping by stopping plate 94 is released, the tips of each of feeding claw 84 and feeding claw 86 are inserted into indexing holes FH at the same time. After being inserted, by advancing support plate 78, taped components TP are sent by the advancing amount. Further advancing amounts are adjusted to be a distance equal to hole pitch p2.

As understood from FIGS. 9(*a*) and 10(*a*), and FIGS. 9(*b*) and 10(*b*) showing views from above (with feeding claw 84 omitted), on the side of guide rail 62 opposite to feeding claw 84 and feeding claw 86, that is, the left side of taped components TP, reverse rotation prevention claw 96 is rotatably arranged. If the front side in the feeding direction of taped components TP is the downstream side, and the rear side the upstream side, reverse rotation prevention claw 96 is provided on the downstream side of feeding claw 84. Reverse rotation prevention claw 96, by the force of spring 98, which is a compression spring, is biased to the right, and when taped components TP are fed by just the advancing amount as described above, reverse rotation prevention claw 96 is inserted into indexing holes FH. When reverse rotation prevention claw 96 is inserted into indexing holes FH, displacement to the upstream side of tape components TP is prohibited. Note that, reverse rotation prevention claw 96 has an upstream side face that has a tip at an angle, so even in a state inserted into feeding holes FH, when taped components TP are fed to the downstream side, by the feeding force, against the biasing force of spring 98, reverse rotation prevention claw 96 is separated from indexing holes FH.

In a state with reverse rotation prevention claw 96 inserted into indexing hole FH, by retracting first slide 72, feeding claw 84 and feeding claw 86 are also retracted with taped components TP remaining in place. As understood from descriptions of operation given above, feeding mechanism 70 is configured such that feeding claw 84 and feeding claw 86 engage with indexing holes FH, and by the movement of feeding claw 84 and feeding claw 86 taped components TP are fed in the feeding direction, and by a single retraction operation of air cylinder 74, taped components TP are fed downstream by feeding pitch p3, which is the same as hole pitch p2 and the above-mentioned arrangement pitch p1.

iii) Positioning Mechanism and Lead Cutting Mechanism

Figure 11:
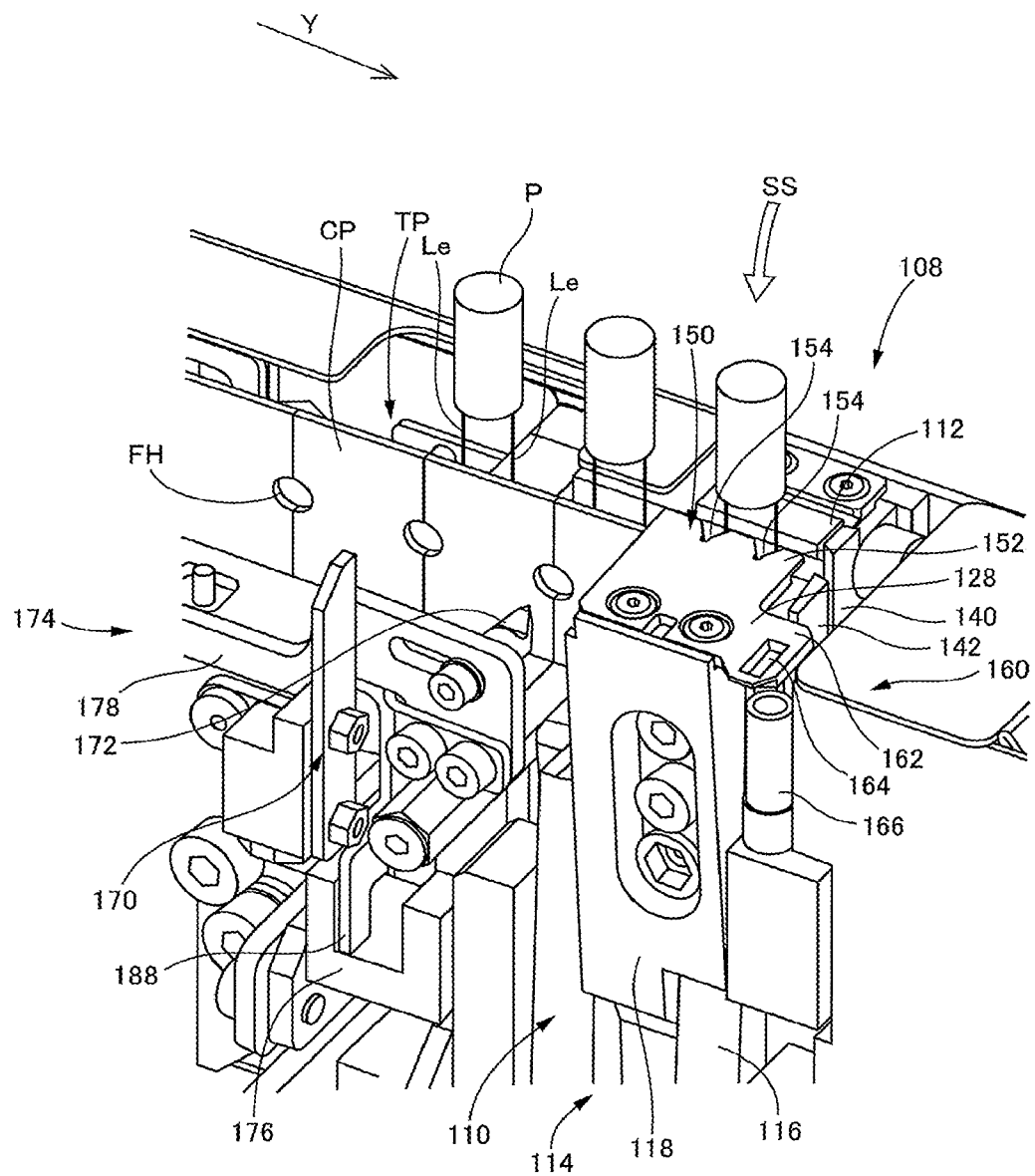
FIG. 11 is a perspective view showing a positioning mechanism provided on the component feeder.

Component feeder 26, as shown in FIGS. 7 and 8, includes a mechanism that positions component P at the above-mentioned supply position SS, in detail, as shown in FIG. 11, positioning mechanism 108 for positioning each of the two leads Le of component P in the feeding direction. Positioning mechanism 108 also acts as a mechanism for cutting a surplus portion of two leads Le of component P positioned at supply position SS.

To describe in detail with reference to FIGS. 7, 8, 11, and 12, positioning mechanism 108, broadly, is configured from the main component of clamp 110 for performing opening and closing operation that includes a first member and a second member that move relative to each other. Specifically, clamp 110 includes fixing block 112 fixed to the feeder main body, and lever 114 that is swingably held on the feeder main body. Note that, lever 114 functions as one of the first member and the second member, and fixing block 112 functions as the other of the first member and the second member.

Figure 12:
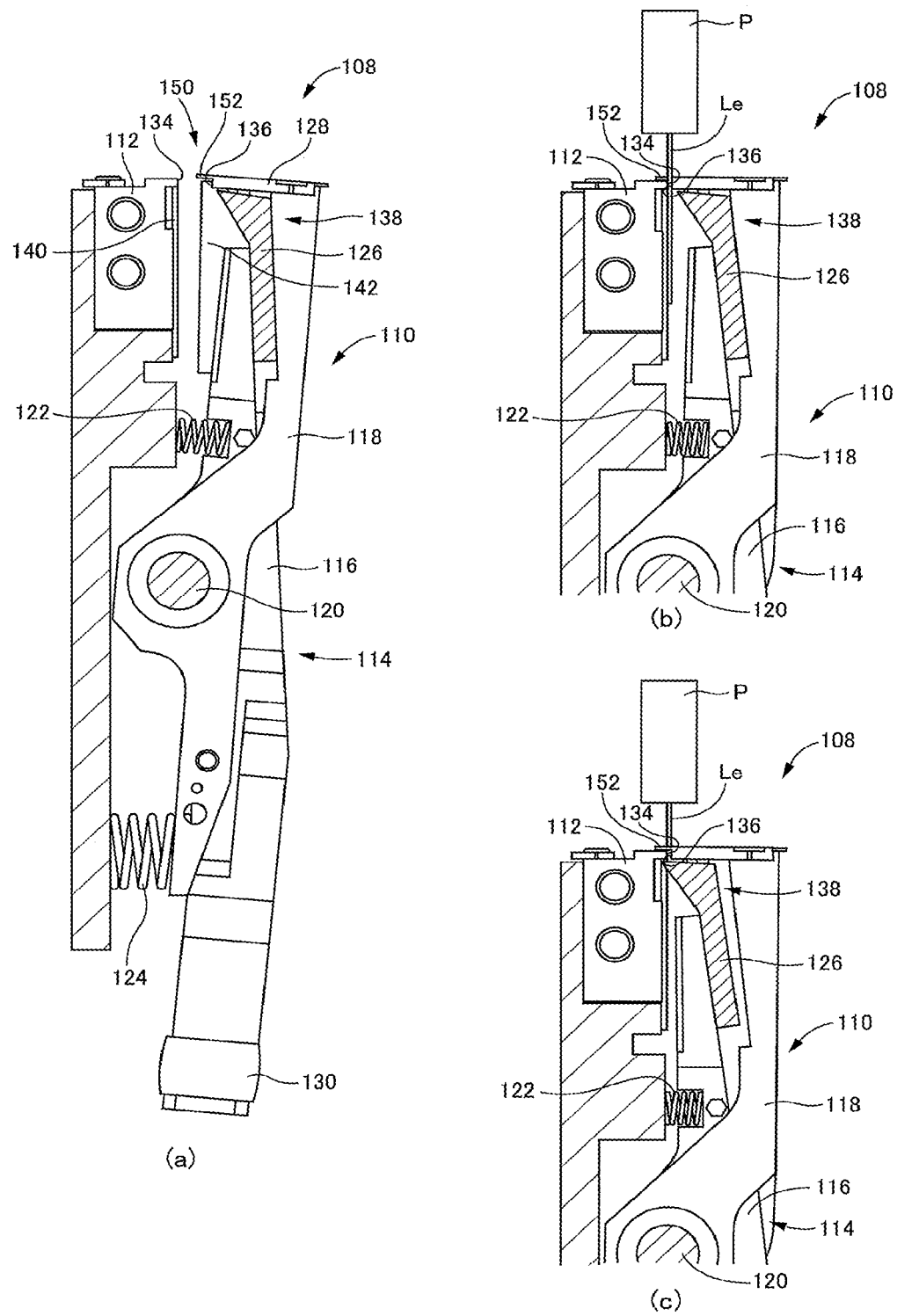
FIG. 12 is a cross section of a clamp that configures the positioning mechanism.

Lever 114 is configured from main lever 116 of which the upper section is divided into two branches, and sub-lever 118 that intersects with main lever 116 using the branched portion, and these are swingable around shared axis 120. As shown in FIG. 12(*a*), the upper end of main lever 116 is biased to the right by the biasing force of spring 122 that is a compression coil spring, and the lower end of sub-lever 118 is biased to the right by the biasing force of spring 124 that is a compression coil spring.

Plate 126 is attached to the top end of main lever 116, and sandwiching plate 128 is attached to the top end of sub-lever 118. As shown in FIG. 8, roller 130 is attached to the lower end of main lever 116, and roller 130 functions as a cam follower such that, when first slide 72 advances, roller 130 engages with cam surface 132 provided on the front end of first slide 72.

The biasing force of spring 122 is greater than the biasing force of spring 124, so in a state shown in FIG. 12(a), sub-lever 118 contacts the rear surface of blade 126, and the top ends of main lever 116 and sub-lever 118 are positioned to the right, that is, clamp 110 is in an open state. In this state, blade 126 and sandwiching blade 128 are separated from fixing block 112.

When first slide 72 is advanced, the upper end of main lever 116 swings to the left, and in accordance with this, sub-lever 118 also swings in the same direction. When main lever 116 and sub-lever 118 have swung to a given extent, as shown in FIG. 12(b), the swinging of sub-lever 118 is stopped in a state with leads Le of component P sandwiched between sandwiching surface 134 provided on fixing block 112 and sandwiching surface 136 provided on sandwiching blade 128. The portion at which sandwiching surface 134 is provided on fixing block 112, and the portion at which sandwiching surface 136 is provided on sandwiching blade 128 each function as a sandwiching section, and leads Le of component P are sandwiched by these sandwiching sections. In this state, leads Le are sandwiched by the biasing force of spring 124.

Further, when main lever 116 is swung, as shown in FIG. 12(c), leads Le are cut by the tip of blade 126 and the lower end of sandwiching surface 134 of fixing block 112. The tip of blade 126 and the lower end of sandwiching surface 134 of fixing block 112 functions as a pair of blades provided with the above-mentioned first member and second member, and by this pair of blades, leads Le are cut at the tip end (lower end) of the portion sandwiched by the above-mentioned sandwiching section. That is, component feeder 26 is provided with lead cutting mechanism 138 that cuts leads Le by the opening and closing operation of a clamp configured from the pair of blades at supply position SS.

The component for which leads Le are cut at supply position SS is held by chuck device 36 of mounting head 20 described above in a state with leads Le held by clamp 110, and after clamp 110 is opened, the component is moved by mounting head 20 and mounted onboard S. Opening operation of clamp 110 is performed by first slide 72 retracted using the biasing force of spring 122 and spring 124. Operation to and from the open position shown in FIG. 12(a) and the closed position shown in FIG. 12(b), that is, opening and closing operation of clamp 110, is performed in accordance with the retracting operation of first slide 72, and thus is linked to the operation of feeding mechanism 70 described above.

Note that, as shown in FIG. 11, edge 140 and edge 142 for cutting carrier tape CT are respectively provided on the front end of fixing block 112 and the front end of main lever 116, and by the opening and closing operation of clamp 110, a portion of carrier tape CT remaining after components P have been supplied is cut. The cut portion of carrier tape CT is collected in waste tape collection box 56 via collection path 144 (refer to FIG. 6).

With positioning mechanism 108, it is important to position the two leads Le of component P appropriately in the feeding direction of taped components TP. Thus, guidance section 150 is provided on the upper end of lever 114 that is one of the first members and the second member, in detail, sandwiching plate 128 provided on the upper end of sub-lever 118.

Sandwiching plate 128 includes thin protruding portion 152 that protrudes from sandwiching surface 136. Two V-notches 154 and 154 that respectively open towards fixing block 112 that is the other of the first member and the second member are formed in protruding portion 152 corresponding to the two leads Le in a case when clamp 110 is in the closed position. When clamp 110 is closed, protruding portion 152 moves to cover fixing block 112, and by the V-notches 154 and 154, the two leads Le are guided to a regulated position, that is, a position at the bottom of the valley of V-notches 154 and 154. In this manner, guidance section 150 is configured including multiple V-notches 154 in accordance with the quantity of leads Le of component P.

Figure 13:
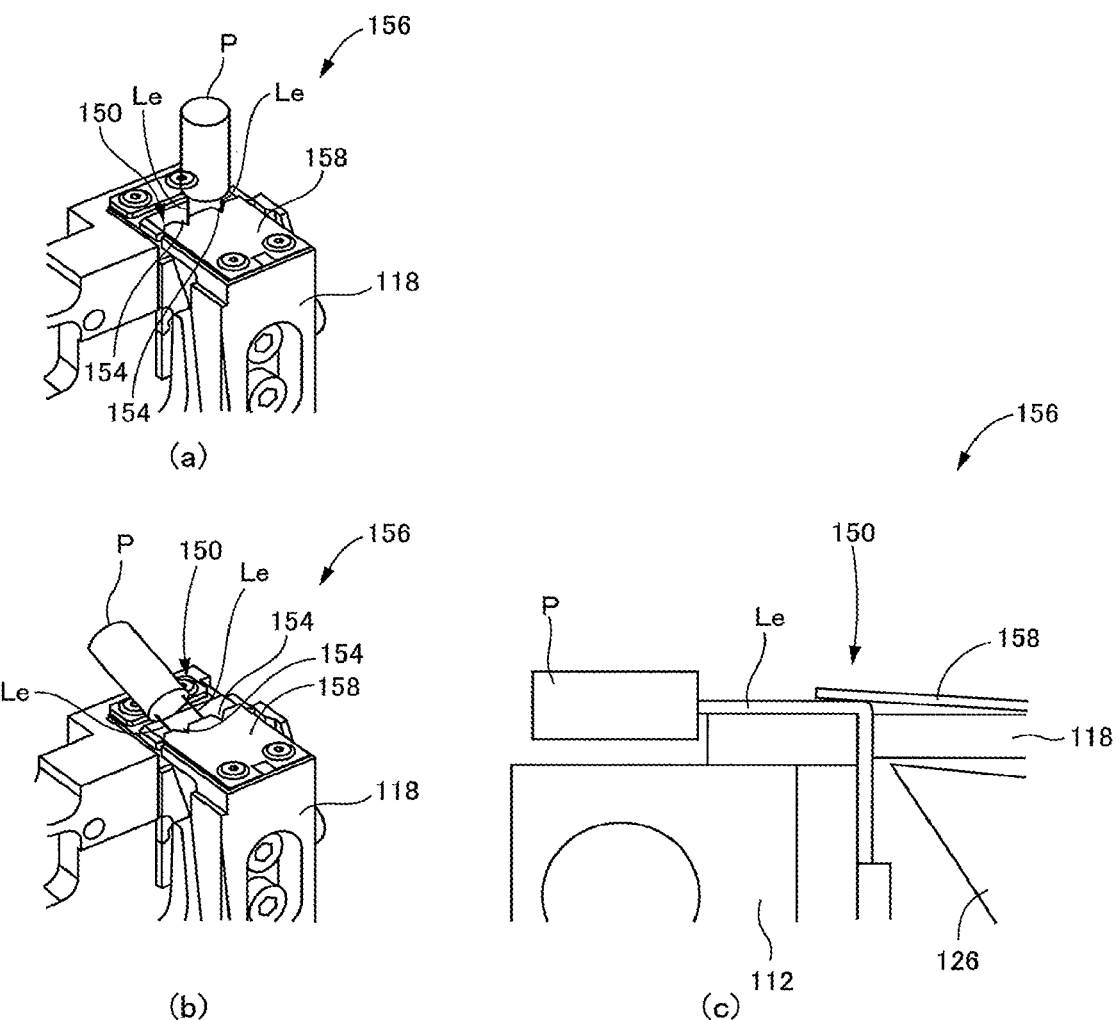
FIG. 13 is a perspective view and a schematic side view of a state of leads of a component at the supply position being positioned by the positioning mechanism.

Depending on the type of component P, there are various quantities of leads Le, lead Le diameters, lead Le positions, intervals between leads Le, and the like, so depending on the components P supplied, it is necessary to change the quantity, shape, interval between and the like of V-notches 154. For example, one may considered using positioning mechanism 156 shown in FIG. 13(a), that is, a positioning mechanism in which the main body section (sandwiching section) of sandwiching plate 128 described above is integrated with sub-lever 118, and only thin guide plate 158 (guidance section) configured with the above protruding portion 152 is exchanged in accordance with the component P. FIG. 13(a) shows a normal state in which leads Le of component P are sandwiched, but with such a configuration, a problem may occur such as that shown in FIG. 13(b) and schematically from the side in FIG. 13(c). To describe in detail, it is possible that, due to factors such as an inappropriate feeding amount of taped components TP by feeding mechanism 70, or one of the leads Le being bent, one of the leads Le is not positioned appropriately, that is, one of the leads Le may not be inside the opening of V-notch 154. In this case, that lead Le, when clamp 110 is closed, contacts a portion of guide plate 158 not formed with V-notch 154, and guide plate 158 may bend that lead Le, while the tip of the guide plate 158 may itself be raised and mis-shaped as the clamp 110 reaches the correct closed position. Not that, this case is more likely when the diameter of leads Le is small.

To avoid such a situation, with component feeder 26, sandwiching plate 128 is manufactured such that protruding section 152 is integrated with the main body section of sandwiching plate 128, in detail, the main body section and protruding section 152 are formed from a single member, and the entire sandwiching plate 128 is exchanged in accordance with the component P. Because such a configuration is used, that is, because the rigidity of protruding section 152 is relatively high, with component feeder 26, in a case in which a state arises in which a lead Le is not positioned appropriately, clamp 110 does not close to the extent that the close position of clamp 110 is in the appropriate position. Accordingly, by checking whether the closing position of clamp 110 is an appropriate position, it is possible to easily check whether the position of lead Le is appropriate.

iv) Clamp Closing Position Check Mechanism

Considering the above, component feeder 26 is provided with clamp closing position check mechanism 160 for checking the closing position of clamp 110 when leads Le of component P at supply position SS are sandwiched by clamp 110, that is, for checking whether the operation position with clamp 110 in the closed position is appropriate.

Specifically, as shown in FIG. 11, an extended section 162 that extends from sub-lever 118 towards the front is provided on sandwiching plate 128, and detection hole 164 is formed in extended section 162; detection hole 164 is detected by light-reflection sensor 166 provided below the hole, such that by the detection of detection hole 164 by sensor 166, it is possible to check whether the closed position of clamp 110 is appropriate. That is, component feeder 26 is configured with clamp closing position check mechanism 160 that includes detection hole 164 as a detected section provided on a guidance section that is a portion of sandwiching plate 128, and sensor 166 for detecting that hole.

In more detail, a state in which clamp 110 is sufficiently closed is a state in which the closing position of clamp 110 is appropriate, and in that state, light from sensor 166 is reflected by a portion other than detection hole 164, such that the light is detected by sensor 166. Taking this as detection hole 164 not being detected, it is determined that the closing position of clamp 110 is appropriate. On the other hand, in a state in which the closing position of clamp 110 is not appropriate, that is, clamp 110 is not totally closed, light from sensor 166 passes through detection hole 164, and the light is not detected by sensor 166. Taking this as detection hole 164 being detected, it is determined that the closing position of clamp 110 is not appropriate. Note that, when it is determined that the closing position of clamp 110 is not appropriate, operation of component feeder 26 and operation of component mounter 10 are stopped.

Figure 14:
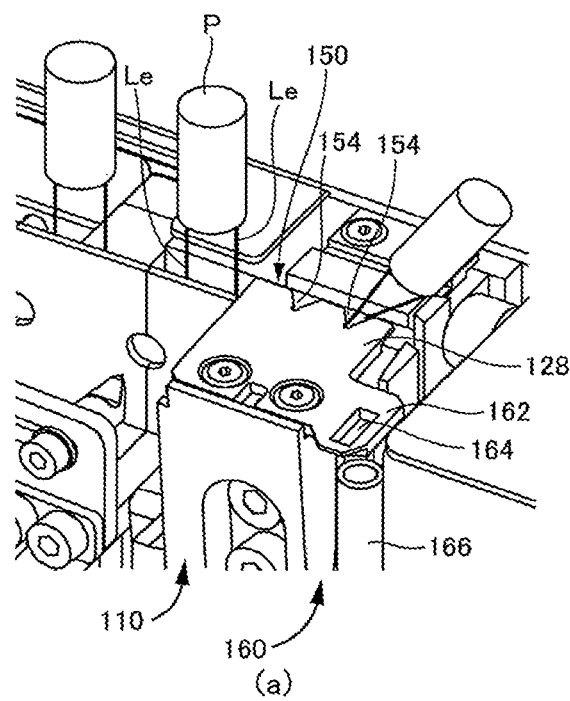
FIG. 14 is a perspective view showing a state of a component with bent leads being positioned and a schematic plan view showing a state of leads being guided to a given position by a guiding section.
Figure 14:
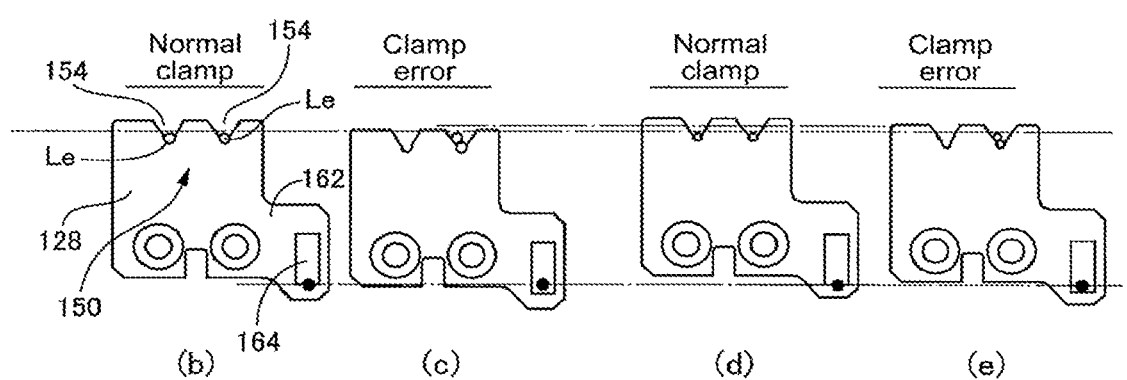

Here, as a special case, for example, assumed is a case in which leads Le are bent and component P is at an angle. In this case, as shown in FIG. 14($a$), it is assumed that the two leads Le are guided by the single V-notch 154. In this case, as shown in FIG. 14($c$) as abnormal clamping, when clamp 110 is closed, the closed position of the clamp 110 is not at the appropriate position. FIG. 14($b$) shows a normal clamp state, while compared to this, with the state shown in FIG. 14($c$), because the two leads Le are overlapping, clamp 110 cannot close completely. Component feeder 26, by detecting inspection hole 164 provided in sandwiching plate 128, is also able to detect a state in which the multiple leads Le are guided into one V-notch 154 (also referred to as a "lead overlapping state").

However, depending on the diameter of leads Le, the normal closed position of clamp 110 will vary, so it is necessary to consider whether the closed position of clamp 110 is appropriate. In detail, for a case of leads Le with a thinner diameter than the leads Le shown in FIGS. 14($b$) and 14($c$), as shown in FIGS. 14($d$) and 14($e$), the appropriate closed position of clamp 110 differs. In the extreme, for component P with leads Le shown in FIGS. 14($d$) and 14($e$), if using the sandwiching plate 128 shown in FIGS. 14($b$) and 14($c$), an incorrect clamp state may be determined to be a normal clamp state.

As described above, with component feeder 26, sandwiching plate 128 provided with guidance section 150 is exchanged in accordance with the component P being handled. Thus, sandwiching plate 128, that is, any sandwiching plate 128 provided with detection hole 164 that is a detection section on guiding section 150, that is, for any guiding section 150, detection hole 164 is provided at a position in accordance with the diameter of leads Le of the corresponding component. By exchanging such a sandwiching plate 128, it is possible to omit the work of performing adjustment of the position of sensor 166 in accordance with the component P.

Note that, considering the function of clamp closing position check mechanism 160 as described above, clamp closing position check mechanism 160 functions as the lead position checking mechanism for performing a check at supply position SS as to whether the positions in the feeding direction of the multiple leads Le of component P sent to the supply position SS are appropriate.

(v) Feeding Check Mechanism

Because component P, or more precisely, leads Le of component P are positioned at a regulated position by the above positioning mechanism 108 at supply position SS, one assumes that the feeding amount of taped components TP by the above feeding mechanism 70 is appropriate, that is, the components are fed accurately by a feeding pitch of exactly p3. Considering this, component feeder 26 is provided with a feeding check mechanism for checking whether taped components TP are indexed by feeding mechanism 70 at feeding pitch p3.

As shown in FIG. 8, feeding check mechanism 170 is provided between feeding mechanism 70 and positioning mechanism 108 in the feeding direction. That is, it is provided downstream of feeding mechanism 70 and upstream of positioning mechanism 108. To describe in detail with reference to FIGS. 9 and 10, feeding check mechanism 170 is configured including: pin 172 inserted into indexing hole FH provided in carrier tape CT of taped components TP; pin inserting mechanism 174 for inserting pin 172 into indexing hole FH; and sensor 176 for detecting whether pin 172 has been inserted into indexing hole FH by pin inserting mechanism 174.

Specifically, pin 172 is supported on swing lever 178 as a rotating body. Swing lever 178, as illustrated in FIGS. 9($c$) and 10($c$) centered around swing lever 178 and pin 172, is configured such that a shaft (not shown) is inserted into shaft hole 180 so as to be held on the feeder main body in a manner swingable around a center axis line of shaft hole 180. Swing lever 178 is biased to the left by spring 182, which is a compression coil spring. On the other hand, roller 184 is provided on support bar 78 as described above, and in a state with support bar 78 retracted, as shown in FIG. 9, roller 184 contacts vertical wall section 186 of swing lever 178. Thus, pin 172 is retracted to a position in a state displaced to the right of guide rail 62, that is, to a position that does not interfere with the feeding of taped components TP.

When support bar 78 is advanced, that is, when taped components TP are fed by feeding mechanism. 70, as shown in FIG. 10, roller 184 is advanced to a position not engaging with vertical wall 186, and swing lever 178 is displaced to the left by the biasing force of spring 182. Since pin 172 is positioned at a position forward of reverse rotation prevention claw 96 by exactly indexing pitch p3 (which is equal to hole pitch p2 of indexing holes FH), in a case in which taped components TP are fed correctly by feeding mechanism 70 by feeding pitch p3, pin 172 is inserted into feeding hole FH by being displaced to the left. That is, rollers 184 are configured with pin insertion mechanism 174 including swing lever 178 and the like. Note that, by support bar 78 being retracted, roller 184 engages with side wall section 186 and returns to the state shown in FIG. 9.

Swing lever 178 is provided with detected member 188, and detected member 188 is also moved to the left by the displacement to the left of pin 172, that is, the insertion of pin 172 into indexing hole FH. Sensor 176 is configured to detect movement of detected member 188. Sensor 176 is a type configured from a light source and a detecting section that detects light from the light source, and in a case in which pin 172 is correctly inserted into indexing hole FH, light from the light source is blocked from reaching the detecting section, and by the blocking of the light, it is determined that pin 172 has been inserted into indexing hole FH. Note that, in a case in which the feeding amount is not feeding pitch p3, pin 172 is prevented from moving to the left by contacting a location on carrier tape CT at which there is no indexing hole FH. In this case, because detected member 188 does not block the light from the light source from reaching the detecting section, it is determined that pin 172 has not been inserted into indexing hole FH. Note that, in this case, due to the feeding amount not being appropriate, operation of component feeder 26 and operation of component mounter 10 are stopped.

As described above, operation of feeding check mechanism 170, in detail, operation of pin inserting mechanism 174, is performed in accordance with the movement of support bar 78, and is linked to feeding operation of feeding mechanism 70. Also, the tip of pin 172 is tapered, such that even in a case in which the feeding pitch by feeding mechanism 70 is slightly deviated from feeding pitch p3, the deviation is rectified by pin 172 being inserted into indexing hole FH.

Note that, as a cause of the feeding pitch not being equal to pitch p3, for example, one might consider carrier tape CT being cut at the tip of taped components TP as shown in FIG. 5(c). Based on the configuration of the above-described feeding mechanism 70, as shown in FIG. 5(b), when cutting is performed at the center of indexing hole FH, the feeding amount is appropriate, but as shown in FIG. 5(c), in a case in which cutting is performed at a point other than indexing hole FH, the feeding amount becomes slightly smaller or larger. Feeding check mechanism 170 is able to check whether the feeding is not appropriate due to such a cause.

D. Supply of a Component with Three Leads

The basic configuration of component feeder 26 has been described while describing supply of a component with two leads. The component feeder is also configured to supply components with three leads, and supply of a component with three leads is described below.

(i) Component with Three Leads and Taped Components Thereof

Component P with three leads Le extending in one direction from component main body PB (also referred to as a "three-leaded component") is prepared as taped components TP as shown in FIG. 15(a). Similar to taped component TP for components P with two leads Le as shown in FIG. 5(a), component P with three leads Le is held by the three leads Le in carrier tape CT consisting of main tape CT1 and sticky adhesive tape CT2 affixed to main tape CT1. Similarly, hole pitch p2 of indexing holes FH formed in carrier tape CT and arrangement pitch p1 of components Pare equivalent to those shown in FIG. 5(a).

As shown in FIG. 15(b), with three-leaded component P, when being mounted on board S, each of the leads Le is inserted into hole H provided in the board S. Here, the two leads Le positioned on the outside (also referred to as "outside leads Leo") are cut and bent at the underside of board S (which is so-called cut and clinch processing); in contrast, there are cases in which the center lead Le (also referred to as "center lead Lei") is not bent. When mounting such a component P, as shown in FIG. 15(c), it is desirable to supply component P in a state with outside leads Leo cut to first length L1 and center lead Lei cut to second length L2 that is shorter than first length L1.

(ii) Second Lead Cutting Mechanism

Figure 16:
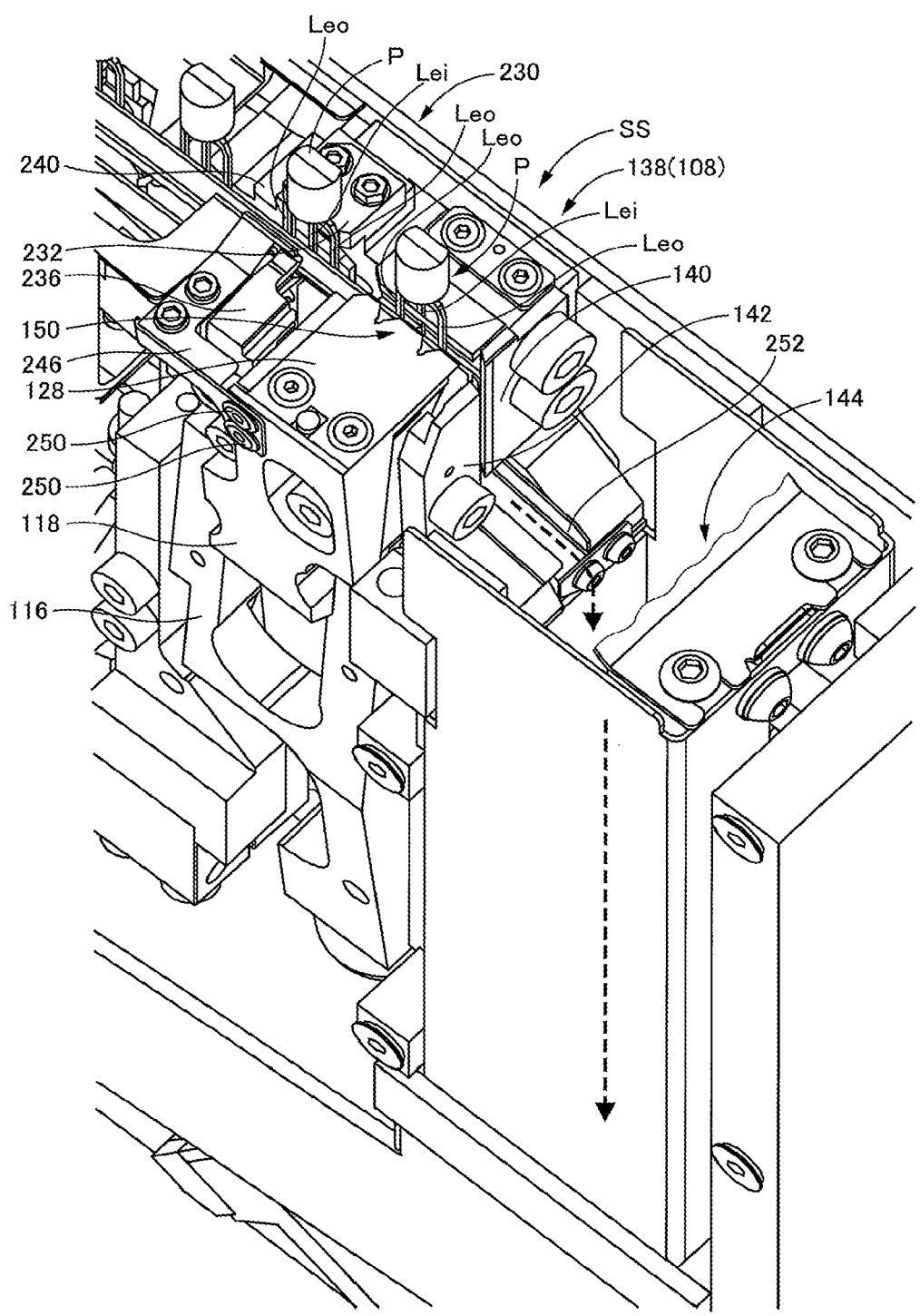
FIG. 16 is a perspective view showing a second lead cutting mechanism attached for supplying components with three leads.

Considering the above, component feeder 26, if the above lead cutting mechanism 138 is considered to be a first lead cutting mechanism 138, in addition to that first lead cutting mechanism 138, as shown in FIG. 16, is provided with another lead cutting mechanism, second lead cutting mechanism 230. First lead cutting mechanism 138 is provided at supply position SS that is a position at which components are supplied; in contrast, second lead cutting mechanism 230 is provided upstream in the feeding direction of taped components TP, that is, at a position forward in the feeding direction of supply position SS. In detail, it is provided at a position forward by exactly feeding pitch p3 that is the feeding pitch of taped components TP by feeding mechanism 70, that is, a position forward by exactly arrangement pitch p of components P, so as to cut center lead Lei only before the two outside leads Leo are cut by first lead cutting mechanism 138.

Figure 15:
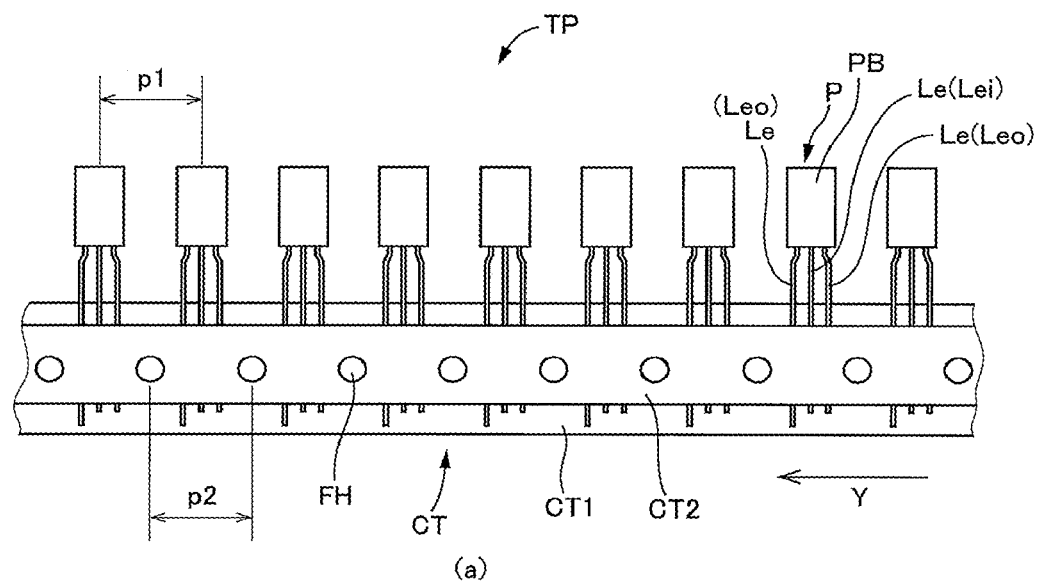
FIG. 15 shows a component with three leads and those components in taped component form.
Figure 15:
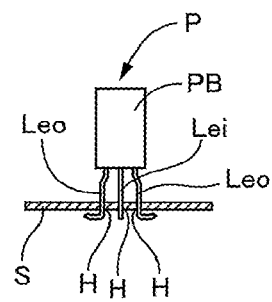
Figure 15:
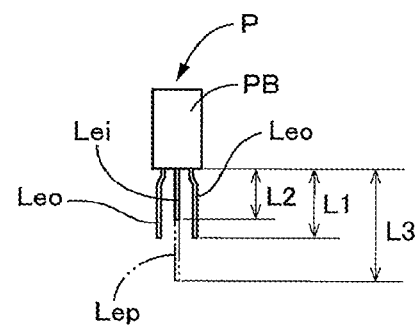

As described above, first lead cutting mechanism 138 is integrated with the above positioning mechanism 108, and with this positioning mechanism 108, sandwiching plate 128 is provided on the top of sub-lever 118. Because guidance section 150 is provided on this sandwiching plate 128, first lead cutting mechanism 138 may be considered to include guidance section 150 provided above the cutting edge and that guides the two outside leads Leo to be positioned in the feeding direction. If center lead Lei is cut to the second length L2 by second lead cutting mechanism 230, the cut center lead Lei, when carrier tape CT is fed such that component P is positioned at supply position SS, is positioned such that the tip thereof is positioned above guidance section 150, and center lead Lei does not interfere with guidance section 150. However, the portion removed by the cutting that was the center lead Lei remaining in carrier tape CT may interfere with guidance section 150 at this time. Considering this, second lead cutting mechanism 230 is configured to also cut center lead Lei at a point further away from component main body PB than the location at which center lead Lei becomes the second length L2 (this point is shown in FIG. 15[c], and if center lead Lei was cut only there, the length of center lead Lei would be third length L3). That is, second lead cutting mechanism 230 is configured to cut center lead Lei at two positions with different heights. Note that, the two positions are also referred to below as second length position PL2 and third length position PL3.

Figure 17:
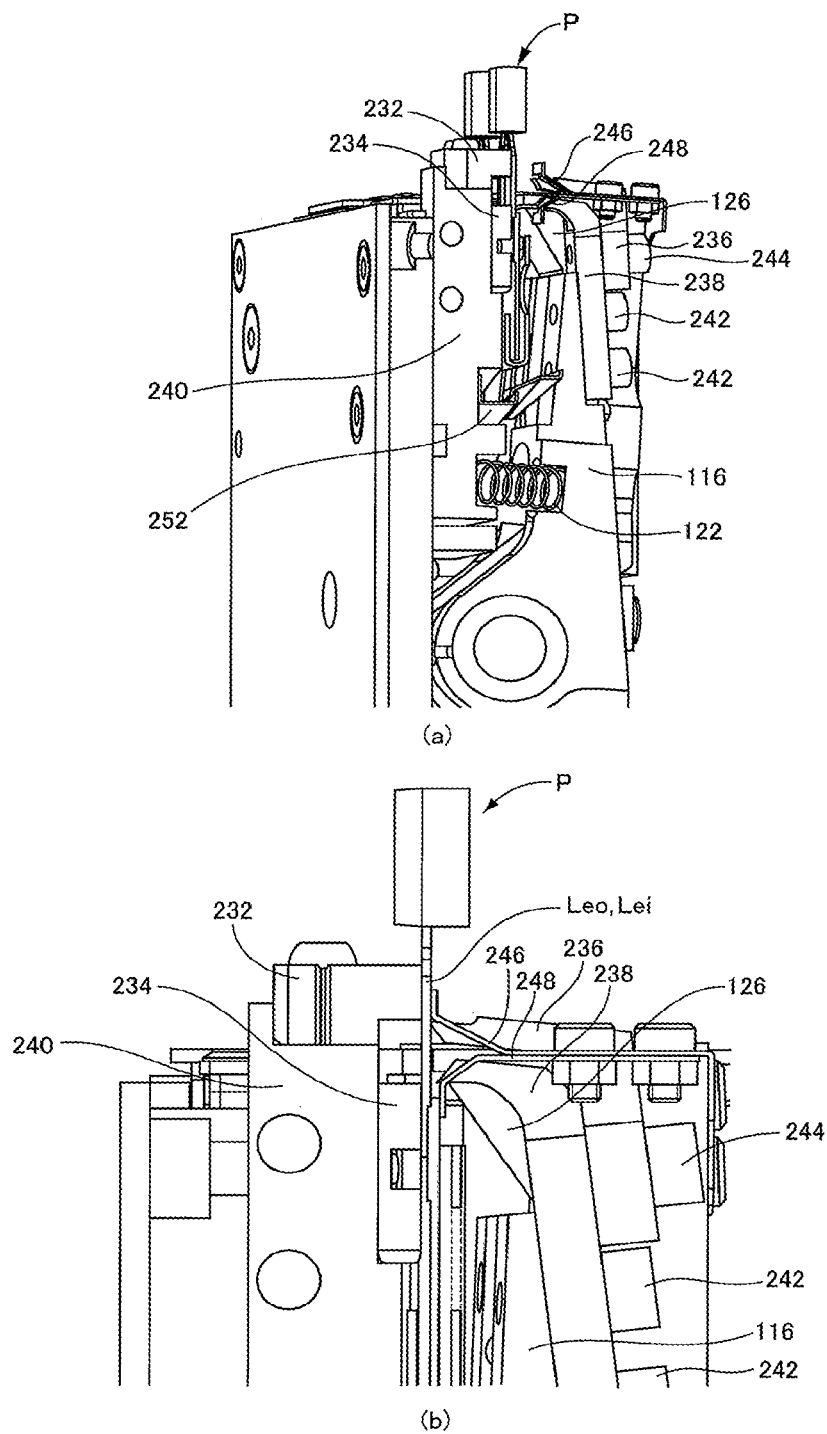
FIG. 17 is a perspective view of the second cutting mechanism from a different viewpoint to FIG. 16.

Regarding the detailed configuration of second lead cutting mechanism 230, to describe with reference to FIG. 17, second lead cutting mechanism 230 is configured including upper fixed block 232 and lower fixed block 234 that are two fixed blocks, and upper plate 236 and lower plate 238 that are two plates. Upper fixed block 232 and lower fixed block 234 are fixed to the feeder main body by being supported on support block 240 fixed to feeder main body by a bolt (not shown) that is a fastening member via fixing block 112 of first lead cutting mechanism 112. Lower blade 238 is approximately L-shaped and is fixed to main lever 116 that configures first lead cutting mechanism 138 at a base section by bolt 242 that is a fastening member. Upper blade 236 is approximately L-shaped and is fixed to lower blade 238 at a base section by bolt 244 that is a fastening member.

The bottom end of the portion of upper fixed block 232 that protrudes to the right, and the leading edge of upper blade 236 function as a pair of cutting edges that cut center lead Lei at second length position PL2; the top end of the portion of lower fixed block 234 that protrudes to the right, and the leading edge of lower blade 238 function as a pair of cutting edges that cut center lead Lei at third length position PL3. Upper blade 236 and lower blade 238, by the swinging of main lever 116 of first cutting mechanism 138 described above, are operated together with blade 126 that functions as a cutting edge in first lead cutting mechanism 138, and the cutting of center lead Lei at two points by second lead cutting mechanism 230 is synchronized with the cutting of the two outside leads Leo by first cutting mechanism 138. According to this configuration, component feeder 26 performs cutting operation by first lead cutting mechanism 138 and cutting operation by second lead cutting mechanism 230 at the same time by using a single driving source, air cylinder 74. Because the configuration does not include a drive source for each of the lead cutting mechanisms 138 and 230, the component feeder can have two lead cutting mechanisms but still be compact, and the manufacturing costs of the component feeder are reduced.

Also, second lead cutting mechanism 230 is for appropriately cutting center lead Lei, and includes two lead retaining plates, upper lead retaining plate 246 and lower lead retaining plate 248. These are formed by performing metal plate processing on a relatively thin steel plate. Upper lead retaining plate 246 is fixed at a base section to sub-lever 118 included in first lead cutting mechanism 138 by bolts 250 that are fastening members, and lower lead retaining plate 248 is fixedly fastened on top of upper lead retaining plate 246. Accordingly, upper lead retaining plate 246 and lower lead retaining plate 248 swing with sub-lever 118, and immediately before cutting, each of them are, at the tip section, pushing respectively either center lead Lei only, or center lead Lei and the one outside lead Leo upstream in the feeding direction, against upper fixed 232 and lower fixed block 234. The tips of both upper lead retaining plate 246 and lower lead retaining plate 248 are formed to be inclined and to either be raised or lowered to be perpendicular, and by using their own elastic counterforce that comes from such a shape, push against either center lead Lei only or center lead Lei and the one outside lead Leo upstream in the feeding direction. Note that, with second lead cutting mechanism 230, even though holding of lead Lei (Leo) is performed using such retaining plates 246 and 248, positioning by positioning mechanism 108 at component supply position SS, that is, positioning in the feeding direction of outside leads Leo by V-notch 154 is not performed. This is in consideration of the fact that, when performing such positioning for both cutting by second lead cutting mechanism 230 and cutting by first lead cutting mechanism, due to a slight deviation from the arrangement pitch p of component P, a slight position deviation in lead Le, bending of lead Le, or the like, positioning during cutting by second lead cutting mechanism 230 may obstruct positioning at component supply position SS. In other words, based on this consideration, when performing cutting by second lead cutting mechanism 230, the configuration is such that holding of lead Lei (Leo) only is performed simply by the elastic force of retaining plates 246 and 248.

Because center lead Lei is cut at two points by second lead cutting mechanism 230, that is, second length position PL2 and third length position PL3, the portion between those points is cut away from carrier tape CP and component P, and becomes the so-called chip that is cut lead portion Lep (refer to FIG. 15 [c]). Because cut lead portion Lep drops down, with component feeder 26, to catch the falling cut lead portion Lep, tray 252 that is relatively long and thin is provided between support block 240 and main lever 116 sloping with respect to the feeding direction.

As described above, first lead cutting mechanism 138 is configured to cut a portion of carrier tape CP that remains after components P have been supplied at a position downstream (front side) of supply position SS in the feeding direction of taped components TP, and collection path 144 is provided to function as an ejection path for ejecting that cut portion. The front end of tray 252 overlaps collection path 144, and cut lead portion Lep that has fallen onto tray 252 is guided to collection path 144 as shown by the dashed line arrow in FIG. 16. By using such a configuration, it is not necessary to provide a dedicated ejection path for cut lead portion Lep, enabling the component feeder to be more compact.

As described above, with component feeder 26, with respect to a basic configuration that supplies components P with two leads Le, simply by attaching second lead cutting mechanism 230 using a fastening member, it is possible to supply a component P with three leads. Conversely, simply by releasing the fastening member and removing second lead cutting mechanism 230, it is possible to use the component feeder to supply components P with only two leads Le. Accordingly, component feeder 26 is a feeder with excellent versatility.

Note that, when mounting a supplied three-leaded component P onto board S, instead of the above-described chuck device 36 shown in FIGS. 3 and 4, a dedicated chuck device may be used. Descriptions of such a chuck device are omitted from this disclosure.

REFERENCE SIGNS LIST

26: component feeder; 70: feeding mechanism; 108: positioning mechanism; 112: fixing block; 114: lever; 116: main lever; 118: sub-lever; 126: blade; 128: sandwiching plate; 134: sandwiching surface; 136: sandwiching surface; 138: lead cutting mechanism (first lead cutting mechanism); 140: cutting edge; 142: cutting edge; 144: collection path (ejection path); 150: guidance section; 156: positioning mechanism; 230: second lead cutting mechanism; 232: upper fixed block; 234: lower fixed block; 236: upper blade; 238: lower blade; 240: support block; 242: bolt; 244: bolt; 246: upper lead retaining plate; 248: lower lead retaining plate; 250: bolt; 252: tray; S: board; H: hole; P: component; PB: component main body; Le: lead; Leo: outside lead; Lei: center lead; Lep: cut lead portion; TP: taped component; CT: carrier tape; p1: arrangement pitch; p3: feeding pitch; SS: supply position

The invention claimed is:

1. A component feeder for consecutively supplying components one at a time to a specified supply position, the components being taped components in which multiple components are held at a specified arrangement pitch in carrier tape by leads, multiple of which extend from a component main body in one direction, the component feeder comprising:
   a feeding mechanism configured to intermittently feed the taped components in a feeding direction at a specified feeding pitch to the supply position;
   a first lead cutting mechanism configured to, for separating the component positioned at the supply position from the carrier tape, for the component having three leads, cut two of the leads that are on an outer side of the three leads at a given position such that a length by which the two leads protrudes from the component main body is a first length; and a second lead cutting mechanism configured to, before the cutting of the two leads by the first lead cutting mechanism, cut a single lead that is at a center of the three leads positioned forward of the supply position in the feeding direction to a second length that is shorter than the first length.

2. The component feeder according to claim 1, wherein both the first lead cutting mechanism and the second lead cutting mechanism include a cutting blade for cutting the leads and a cutting operation by each of the cutting blades is performed in a synchronized manner via a single power source.

3. The component feeder according to claim 1, wherein the second lead cutting mechanism is removably attached.

4. The tape feeder according to claim 1, wherein the first lead cutting mechanism includes a guidance section provided above the cutting blade and configured to guide the two leads to position the two leads in the feeding direction, and the second lead cutting mechanism, to avoid interference of the second lead cutting mechanism and the guidance section when a portion remaining in the carrier tape of the single lead to be cut is positioned at the supply position, is configured to cut the single lead at two positions, a position at which the single lead becomes the second length, and a second position at which the single lead is positioned further separated from the component main body than the position at which the single lead becomes the second length.

5. A component feeder according to claim 1, wherein the first cutting mechanism is configured to cut a portion of the carrier tape in which components being supplied remain at a downstream side of the supply position in the feeding direction, the component feeder includes a discharge path for discharging the cut portion of the carrier tape, and the portion between the two positions of the single lead removed by the cutting at the two positions by the second cutting mechanism is guided by the discharge path.

* * * * *